US011817438B2

(12) United States Patent
Kim et al.

(10) Patent No.: US 11,817,438 B2
(45) Date of Patent: Nov. 14, 2023

(54) SYSTEM IN PACKAGE WITH INTERCONNECTED MODULES

(71) Applicant: Intel Corporation, Santa Clara, CA (US)

(72) Inventors: Hyoung Il Kim, Folsom, CA (US); Bilal Khalaf, Folsom, CA (US); Juan E. Dominguez, Gilbert, AZ (US); John G. Meyers, Sacramento, CA (US)

(73) Assignee: Intel Corporationd, Santa Clara, CA (US)

( * ) Notice: Subject to any disclaimer, the term of this patent is extended or adjusted under 35 U.S.C. 154(b) by 1125 days.

(21) Appl. No.: 16/247,336

(22) Filed: Jan. 14, 2019

(65) Prior Publication Data

US 2020/0227393 A1   Jul. 16, 2020

(51) Int. Cl.
*H01L 25/16* (2023.01)
*H01L 23/00* (2006.01)

(52) U.S. Cl.
CPC .............. *H01L 25/16* (2013.01); *H01L 24/24* (2013.01); *H01L 24/32* (2013.01); *H01L 24/48* (2013.01); *H01L 24/73* (2013.01); *H01L 2224/24195* (2013.01); *H01L 2224/32145* (2013.01); *H01L 2224/32225* (2013.01); *H01L 2224/48105* (2013.01); *H01L 2224/48145* (2013.01); *H01L 2224/48227* (2013.01); *H01L 2224/73265* (2013.01)

(58) Field of Classification Search
CPC ......... H01L 25/16; H01L 24/24; H01L 24/32; H01L 24/48; H01L 24/73; H01L 2224/24195; H01L 2224/32145; H01L 2224/32225; H01L 2224/48105; H01L 2224/48145; H01L 2224/48227; H01L 2224/73265

See application file for complete search history.

(56) References Cited

U.S. PATENT DOCUMENTS

| | | | |
|---|---|---|---|
| 2010/0244208 A1* | 9/2010 | Pagaila | H01L 23/50 257/659 |
| 2015/0187608 A1* | 7/2015 | Ganesan | H01L 23/49811 438/118 |
| 2015/0206854 A1* | 7/2015 | Lane | H01L 24/19 257/737 |
| 2018/0190776 A1* | 7/2018 | Gogineni | H01L 24/49 |

* cited by examiner

*Primary Examiner* — Robert G Bachner
(74) *Attorney, Agent, or Firm* — Schwabe, Williamson & Wyatt, P.C.

(57) ABSTRACT

Embodiments include systems in packages (SiPs) and a method of forming the SiPs. A SiP includes a package substrate and a first modularized sub-package over the package substrate, where the first modularized sub-package includes a plurality of electrical components, a first mold layer, and a redistribution layer. The SiP also includes a stack of dies over the package substrate, where the first modularized sub-package is disposed between the stack of dies. The SiP further includes a plurality of interconnects coupled to the stack of dies, the first modularized sub-package, and the package substrate, wherein the redistribution layer of the first modularized sub-package couples the stack of dies to the package substrate with the plurality of interconnects. The SiP may enable the redistribution layer of the first modularized sub-package to couple the electrical components to the stacked dies and the package substrate without a solder interconnect.

20 Claims, 10 Drawing Sheets

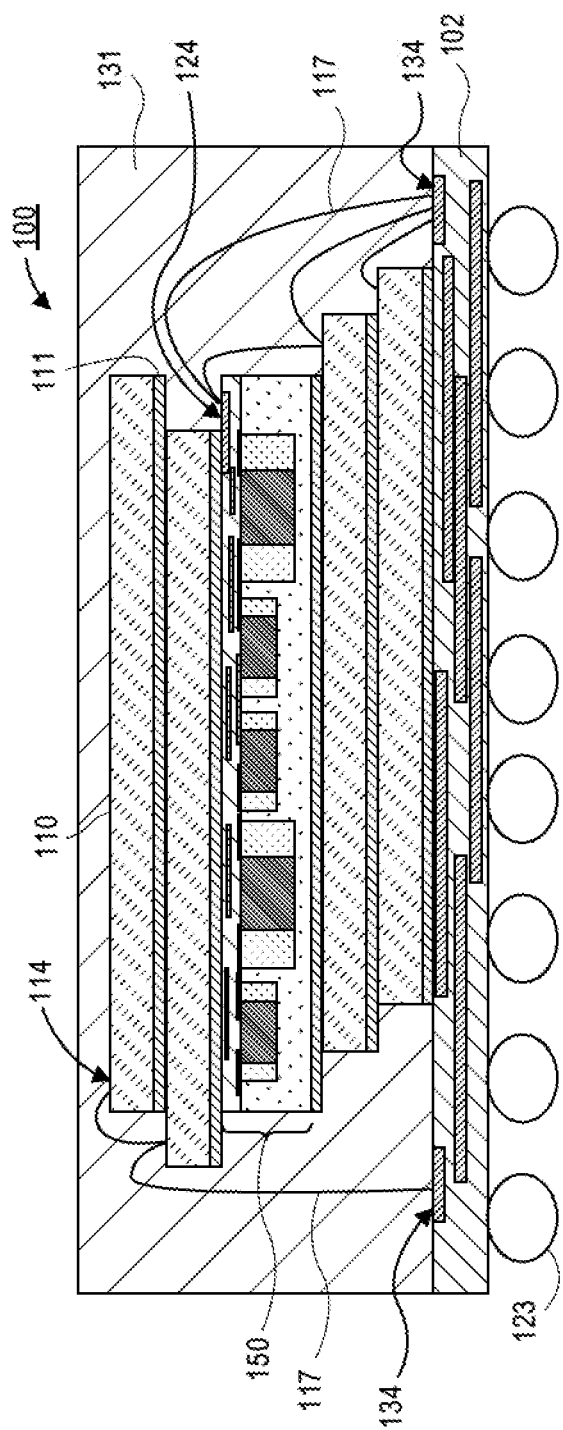
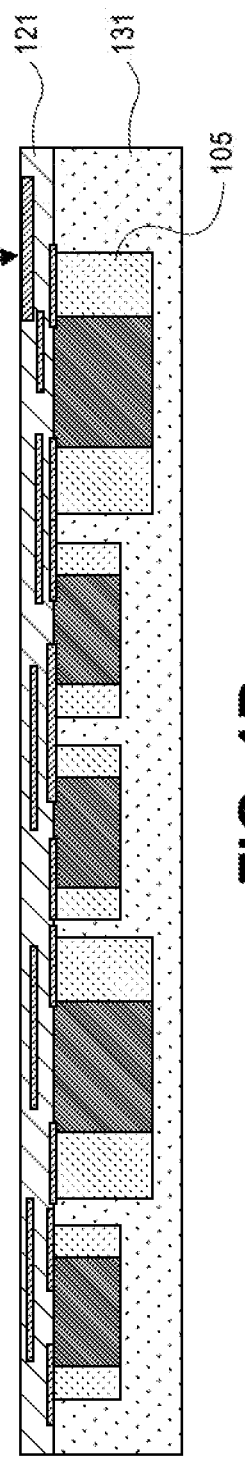
FIG. 1A
FIG. 1B

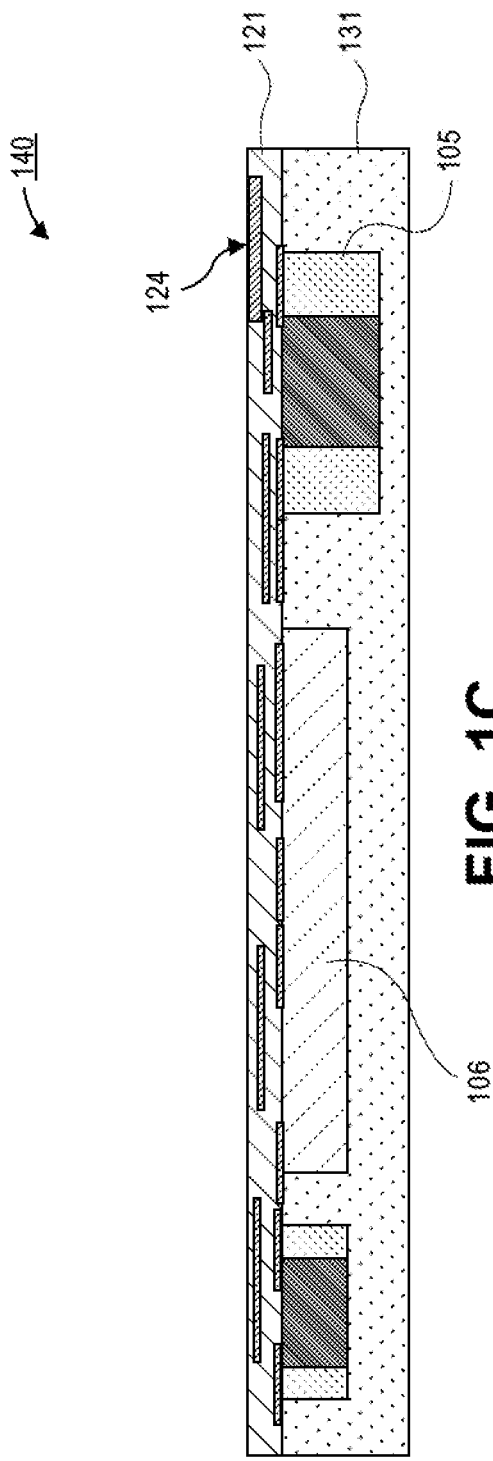

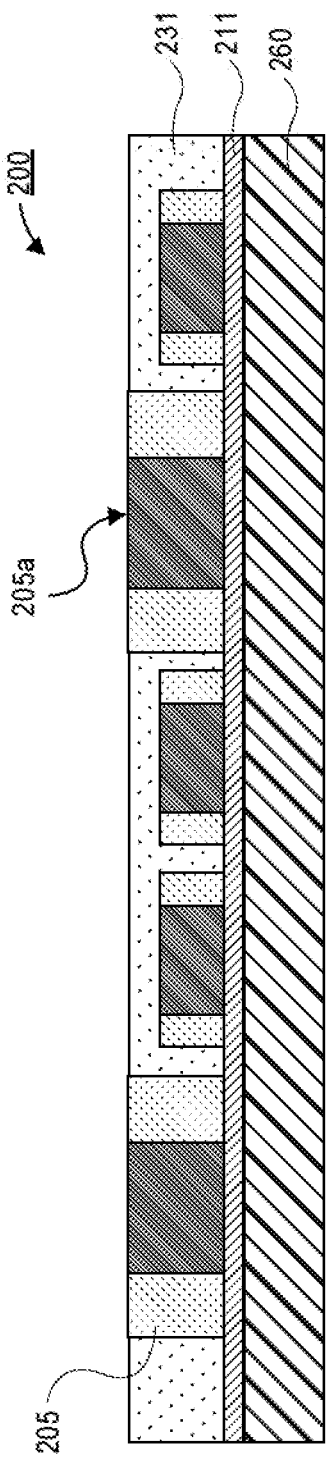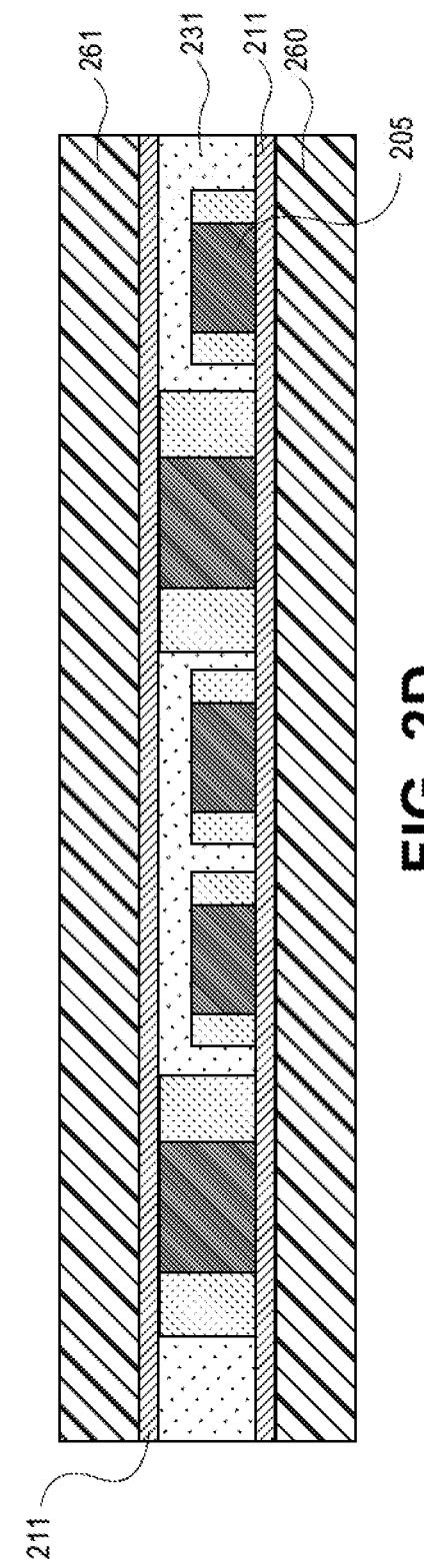

SYSTEM IN PACKAGE WITH INTERCONNECTED MODULES

FIELD

Embodiments relate to packaging semiconductor devices. More particularly, the embodiments relate to a system in package having modularized sub-packages that may include wire bonding or ribbon bonding interconnects.

BACKGROUND

Passives and power components are commonly surface mounted on printer circuit boards (PCBs) or substrates. Various applications, such as system in packages (SiPs), require heterogeneous placements of multiple components within a single package encapsulation. In these applications, once the components are encapsulated in a mold compound, it is extremely difficult to debug and rework. Among these challenges, one of the main challenges faced with SiPs is solder bridging.

For example, a passive component, such as a capacitor, can be surface mounted on a SiP substrate, and then encapsulated within a mold compound. When the SiP substrate is mounted and reflowed on a motherboard, a crack-like delamination generally occurs at the interface between the passive component and the mold compound. During the reflow process, the reflowed solder can travel through the gap and thus short the component and/or the circuit. A similar issue also occurs between the solder balls under small ball grid array (BGA) components which are mounted on the SiP substrate. Accordingly, when there is a mold void (or short) or a crack-like delamination, the reflowed solder can travel and create solder bridging during reflow to cause defects to the component, the circuit, the SiP, and the motherboard.

Solder bridging, therefore, increases the defect rate, increases assembly design rule challenges, and narrows assembly processing window. Some additional challenges with solder bridging typically includes a decreased assembly yield and throughput, an increased substrate design complexity, and a larger component space due to a lowered component density.

Existing solutions to solder bridging has lead some assembly technologies to get rid of solder based interconnects from the SiP assembly. Various attempts have been made to resolve one or more of the solder bridging challenges, including using a higher melting temperature solder paste. A higher melting temperature solder paste, however, requires a higher peak reflow temperature which can lead to severe substrate warpage and additional thermal degradation of the integrated circuits and packaging materials.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIG. 1A is an illustration of a cross-sectional view of a system in package (SiP) having a modularized sub-package using a plurality of interconnects, according to one embodiment.

FIG. 1B is an illustration of a cross-sectional view of a modularized sub-package having a redistribution layer, a plurality of electronic components, and a mold layer, according to one embodiment.

FIG. 1C is an illustration of a cross-sectional view of a modularized sub-package having a redistribution layer, a plurality of electronic components, an integrated circuit (IC) die, and a mold layer, according to one embodiment.

FIGS. 2A-2G are illustrations of cross-sectional views of a process flow to form a modularized sub-package having a redistribution layer, a plurality of electronic components, and a mold layer, according to some embodiments.

DETAILED DESCRIPTION

Figure 2A:
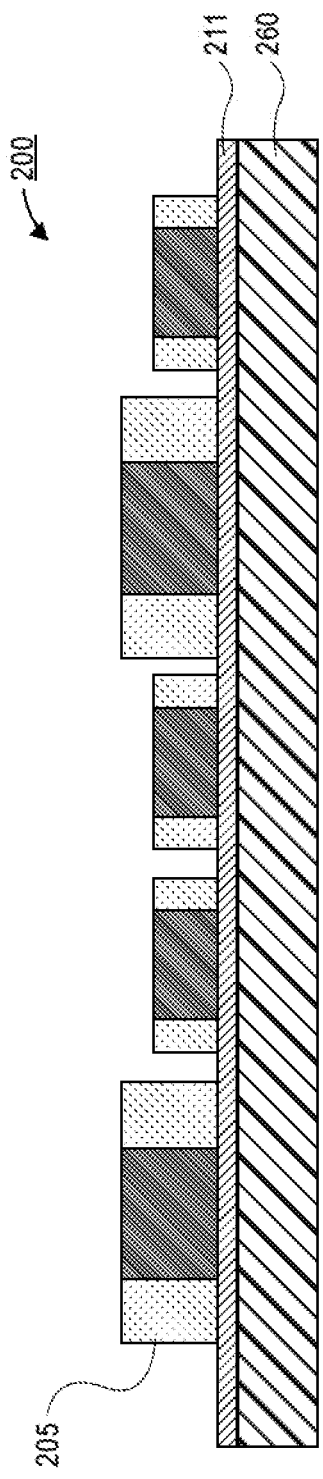

Described herein are system in packages (SiPs) with modularized sub-packages and wire/ribbon bonding interconnects and methods of forming such SiPs. For some embodiments, a modularized sub-package may include a redistribution layer (RDL), a plurality of electronic components (e.g., passive components, integrated circuit (IC) dies, etc.), and a mold layer. The embodiments described herein enable directly disposing (or growing) conductive layers on components to form the modularized sub-packages, and modularizing them into one or more sub-packages using fan-out RDL technology (e.g., the modularized sub-package 150 of FIGS. 1A-1B).

As described herein, a "modularized sub-package" may refer to a package (or a module) that includes a plurality of electrical components disposed on a RDL, where a mold layer (or encapsulation layer) is disposed around and over the electrical components and the RDL. The modularized sub-package may be one of many other similar packages which may be assembled, tested, and subsequently placed/coupled into a SiP system using wire bonding or ribbon bonding interconnect technology, where the SiP system may include one or more additional modularized sub-packages that form such SiP system (e.g., as shown with the SiP system 300 of FIG. 3). Note that the modularized sub-package may be coupled using interconnects and/or directly coupled to another substrate using the RDL. Also note that these modularized sub-packages may be referred to as modules, where these modules may include one portion (or section, circuitry, package, etc.) of a larger package system (e.g., a power module, a sync clock module, a logic module, a memory module, a passive module, and so on).

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including SiPs having one or more modularized sub-packages that may include RDLs, electronic components/dies, and wire/ribbon bonding interconnects.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

The embodiments of the SiP systems/packages described herein improve packaging solutions by (i) modularizing the sub-package approach using wire bonding interconnects as compared to using solder interconnects; (ii) improving the overall assembly yield as these modularized sub-packages (also referred to as modules) may be tested ahead of the full assembly to remove any non-functioning modules or units (i.e., a module may be separated into one or more smaller units), which facilitates a functioning assembly; (iii) increasing product cycle time—and thus reducing time to market—by disposing these modules in advance and having an inventory for any future products that may need one or more of these modules (e.g., an engineer may pick module (or unit) solutions off the shelf and assemble them based on the desired design and/or application); and (iv) enabling customization per customer requirements/needs as the final assembly package may change from customer to customer (e.g., when a company is assembling a cell phone, the full assembly package (or computing device) may include a combination of radio frequency (RF), Bluetooth, Broadband, and/or memory modules as needed per such company's phone assembly requirements, which are generally different from other companies phone assembly requirements).

As described below in Figures in 1A-1C, the SiPs further improve and facilitate packaging solutions by preventing trapped solder shorting during subsequent reflows as solder interconnects are not used; increasing assembly yield and throughput as passive/power modules are pretested prior to integrating the module into the SiP system; reducing package/substrate design complexity as the RDL may be used as an interposer substrate, which thereby relieves design complexity from the main package/substrate; and enabling higher component density as there is no solder reflow process, which thereby enables tighter component space.

FIG. 1A is an illustration of a cross-sectional view of a SiP 100 having a modularized sub-package 150 using a plurality of interconnects 117, according to one embodiment. In some embodiments, the SiP 100 includes a stack of dies 110 (or stacked dies) with adhesive layers 111 disposed over a substrate 102. In other embodiments, the SiP 100 includes a first die 110 (or a stack of first dies) and a second die 110 (or a stack of second dies) with adhesive layers 111 disposed over a substrate 102. Note that, even if FIG. 1A illustrates two stacked dies above and below the modularized sub-package 150, the SiP 100 may have a first die 110 with an adhesive layer 111 disposed over/on the modularized sub-package 150, and a second die 110 with an adhesive layer 111 disposed below/on the modularized sub-package 150 (i.e., the SiP 100 does not require two stacked dies 110 above and below the modularized sub-package 150, as such the SiP 100 may also dispose single dies 110 may above and below the modularized sub-package 150).

For one embodiment, the stacked dies 110 may include, but are not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). As described herein, a "stack of dies" (also referred to as stacked dies) may refer to two or more dies that are stacked on top of each other.

The package substrate 102 may include, but is not limited to, a substrate, a printed circuit board (PCB), and a motherboard. For one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectrics, where each dielectric layer can be a photosensitive dielectric layer. For some embodiments, holes may be drilled in the PCB 102. For one embodiment, the PCB 102 may also include one or more conductive layers that are used to form traces, vias, pads (e.g., conductive pads 134), planes, and/or the like. In one embodiment, the package substrate 102 may include a plurality of solder balls 123 disposed on a bottom surface of the package substrate 102, which may be used to couple to another substrate (e.g., a motherboard).

For some embodiments, the stacked dies 110 may be disposed above the package substrate 102, where the stacked dies 110 are coupled to each other using adhesive layers 111. For one embodiment, the adhesive layers 111 (or adhesive films) may be die attach tapes/films. In other embodiments, the adhesive layers 111 may be a ultra-violet (UV) releasable tapes/films, a double-sided release tapes, and/or any other type of adhesive tapes. In one embodiment, the stacked dies 110 may be stacked on top of each other with an offset between each of the stacked dies 110. In some embodiments, the bottommost die of the stacked dies 110 with the adhesive layer 111 may be disposed directly on a top surface of the package substrate 102.

As shown in FIG. 1A, the stacked dies 110 with the adhesive layers 111 may be disposed above and below the modularized sub-package 150. For example, one adhesive layer 111 may be disposed on/above a top surface of the modularized sub-package 150 (i.e., above a RDL of the modularized sub-package 150), and another adhesive layer 111 may be disposed on a bottom surface of the modularized sub-package 150 (i.e., below a mold layer of the modularized sub-package 150). In one embodiment, the modularized sub-package 150 may include a plurality of electrical components, a mold layer, and a redistribution layer (e.g., as shown in FIGS. 1B-1C). Note that the modularized sub-package 150 is described in further detail below in FIGS. 1B-1C.

For some embodiments, the stacked dies 110 and the modularized sub-package 150 may be coupled to the package substrate 102 by the interconnects 117. In some embodiments, the SiP 100 may utilize the modularized sub-package 150 to couple the plurality of electrical components of the modularized sub-package 150 to the stacked dies 110 and the package substrate 102 without a solder interconnect. That is, the SiP 100 enables coupling the stacked dies 110 and the plurality of components of the modularized sub-package 150 to the package substrate 102 with the interconnects 117—and not using any solder interconnects. In one embodiment, the interconnects 117 may be wire bonding interconnects or ribbon bonding interconnects. Accordingly, the stacked dies 110, the modularized sub-package 150, and the package substrate 102 may be implemented as wire bonded dies, packages, and substrates.

For one embodiment, the interconnects 117 are wire bonding interconnects (also referred to as wire bonds). The wire bonding interconnects of the SiP 100 as shown in FIG. 1A may be substantially similar to those presently known in the art. For example, the interconnects 117 may be wires that are ball-stitch bonded or wedge bonded from one stacked die 110 to another stacked die 110, from the modularized sub-package 150 to one or more stacked dies 110 and/or to the package substrate 102, and from one or more stacked dies 110 to the package substrate 102. In addition, the interconnects 117 may be any commonly used conductive material, such as copper, silver, gold, and/or any other similar metals or alloys. According to some embodiments, the interconnects 117 are disposed in a cascading pattern in order to allow for the interconnects 117 to have flexibility, particularly in flexibility to change interconnect locations and avoid bending and damage.

The interconnects 117 may electrically couple conductive pads 114 of the stacked dies 110 to a conductive pad 124 of the modularized sub-package 150 and conductive pads 134 of the package substrate 102. The interconnects 117 may also couple conductive pads 114 of one or more stacked dies 110 to other conductive pads 114 of the other stacked dies 110. In these embodiments, the interconnects 117 are coupled to the conductive pads 114, the conductive pads 124, and the conductive pads 134, where the conductive pads 114, 124, and 134 are located on the top surfaces of the stacked dies 110, the modularized sub-package 150, and the package substrate 102, respectively. Additionally, the conductive pads 114 and 124 may be located on one of the outer edges of the stacked dies 110 (i.e., the offsetting edges of the stacked dies 110) and of the modularized sub-package 150. For example, the stacked dies 110 and the modularized sub-package 150 may have top surfaces with conductive pads 114 and 124, respectively, on the outer edges, and the interconnects 117 may extend from the conductive pads 114 and 124, forming a wire bonding structure, to couple to the conductive pads 134 on the top surface of the package substrate 102.

As shown in FIG. 1A, the SiP 110 may include a mold layer 131 that is disposed around and over the stacked dies 110, the modularized sub-package 150, the package substrate 102, and the interconnects 117. For one embodiment, the mold layer 131 (or encapsulation layer) is made of an epoxy (e.g., a soft epoxy, a stiff epoxy, opaque epoxy, etc.) with one or more filler materials. In one embodiment, the mold layer 131 may include an epoxy (e.g., a soft epoxy, a stiff epoxy, opaque epoxy, etc.) with one or more filler materials. The mold layer 131 may be selectively disposed, sputtered or deposited on the package substrate 102. That is, the mold layer 131 may be formed with one or more molding/encapsulating processes, such as dispensing/depositing, injection, compression, and/or transfer mold processes.

Accordingly, as shown in FIG. 1A, the SiP 100 provides the modularized sub-package 150 (or a fan-out based passive module) which can be easier to test and wire bonded (e.g., as compared to using surface mount technology (SMT). The SiP 100 also enables no solder intrusion challenges/issues (i.e., as no solder interconnects are used), improved yield, reduced design complexity by using existing wire bonding technology, and reduced overall footprint as the modularized sub-package 150 may be stacked instead of taking real estate on the package substrate 102.

Referring now to FIG. 1B, a cross-sectional illustration of the modularized sub-package 150 is shown, in accordance with an embodiment. In one embodiment, the modularized sub-package 150 may include a redistribution layer 121, a plurality of electronic components 105, and a mold layer 131, according to one embodiment. The electronic components 105 may include any type of passive components, such as capacitors, inductors, resistors, transformers, etc. The electronic components 105 may also be any other type of semiconductor device. In other embodiments, the electronic components 105 may be coupled and disposed adjacently to one or more IC dies (e.g., as shown below with the IC die 106 of FIG. 1C).

For some embodiments, the modularized sub-package 150 may have the plurality of electrical components 105 disposed on a bottom surface of the redistribution layer 121. The modularized sub-package may include the mold layer 131 disposed over the electrical components 105 and the redistribution layer 121, where the electrical components 105 include top surfaces and bottom surfaces that are opposite to the top surfaces. In these embodiments, the bottom surfaces of the electrical components 150 may be directly coupled to the bottom surface of the redistribution layer 121, and the top surfaces of the electrical components 105 may be parallel to a surface (or a planar surface) of the mold layer, where the surface of the mold layer 131 may be positioned below the top surfaces of the electrical components 105. Note that, in alternate embodiments, the surface of the mold layer 131 may be positioned substantially planar to the top surface(s) of the electrical components 105 with the highest z-height (or the greatest thickness) (e.g., as shown in FIG. 2C). Additionally, in some embodiments, the modularized sub-package 150 may include a conductive pad 124 disposed on a top surface of the redistribution layer 121. The conductive pad 124 may be located on an outer edge of the redistribution layer 121, and may have an exposed surface that is substantially planar to the top surface of the redistribution layer 121.

For one embodiment, the RDL 121 may be a dual-sided RDL that may be conductively coupled to other packages and/or electronic components (e.g., dies, capacitors, etc.) above and below the RDL 121. In some embodiments, the RDL 121 may be implemented with one or more conductive pads 124 to couple the electronic components 105 to the stacked dies (e.g., the stacked dies 110 of FIG. 1A), and the electronic components 105 to another substrate (e.g., the package substrate 102 of FIG. 1A), by using wire/ribbon bonding interconnects (e.g., as shown in FIG. 1A).

The RDL 121 may be formed of one or more conductive layers stacked on top of each other and coupled by one or more conductive vias. For example, the RDL 121 may be disposed of alternating layers of organic build-up layers and conductive (e.g., Cu) routing layers and vias, as is known in the art. In one embodiment, the RDL 121 may be formed by sputtering (or disposing/depositing) a conformal conductive layer(s), such as a layer of Cu, Ni, Sn, Au, Ag, Al, an Al alloy, W, Ti, Ta, TiN, TaN, or the like, using any suitable method, including evaporation, sputter, electroplating, printing, jetting, stud bumping, direct placement, or the like.

As described in further detail below in FIGS. 2A-2G, the electronic components 105 may be disposed (or picked and placed) on a carrier or a conductive material. Following methods known in the art, the electronic components 105 may then be embedded (or surrounded) by a mold layer 131, where the mold layer 131 is substantially similar to the mold layer 131 of FIG. 1A. Thereafter, the molded electronic components 105 may be disposed in a way that leaves the conductive pads of such components 105 exposed. From the exposed pads, the RDL 121 (or a polyimide layer) may be disposed (or grown) above such exposed pads of the molded electronic components 105 to directly create connections to the exposed pads of the molded electronic components 105.

Referring now to FIG. 1C, a cross-sectional illustration of the modularized sub-package 140 is shown, in accordance with an embodiment. In one embodiment, the modularized sub-package 140 may include a plurality of electronic components 105, an IC die 106, and a mold layer 131, and a redistribution layer 121 having a conductive pad 124, according to one embodiment. The modularized sub-package 140 is substantially similar to the modularized sub-packages 150 of FIGS. 1A-1B, however this modularized sub-package 140 has both the electronic components 105, such as passive components, and the IC die 106. As such, the RDL 121, the electronic components 105, the IC die 106, and the mold layer 131 of the modularized sub-package 140 may be substantially similar to the RDL 121, the electronic components 105, and the mold layer 131 of the modularized sub-package 150 of FIGS. 1A-1B. Note that, even if FIG. 1C illustrates one IC die 106, the modularized sub-package 140 may include multiple IC dies.

Note that the SiP 100 and the modularized sub-packages 140 and 150 as shown in FIGS. 1A-1C may include fewer or additional packaging components based on the desired packaging design.

FIGS. 2A-2G are illustrations of cross-sectional views of a process flow to form a modularized sub-package 200 having a redistribution layer, a plurality of electronic components, and a mold layer, according to some embodiments. FIGS. 2A-2G are a series of cross-sectional illustrations that depict a process flow to implement the modularized sub-package 200, which may be used in the assembly of a larger overall system (e.g., the SiP 100 of FIG. 1A), in accordance with an embodiment. The modularized sub-package 200 of FIGS. 2A-2G may be substantially similar to the modularized sub-package 150 of FIG. 1B. In these illustrated embodiments, only the formation of the modularized sub-package 200 having electrical components 205 is shown, however it is to be appreciated that the illustrated features are not limiting, and may be formed with additional features, such as additional components, IC dies, conductive layers, etc., at the same time using the same processing operations. Note that well-known features of FIGS. 2A-2G are omitted or simplified in order not to obscure the illustrative implementations.

Referring now to FIG. 2A, a cross-sectional illustration of the modularized sub-package 200 with a plurality of electrical components 205 is shown, in accordance with an embodiment. In one embodiment, the modularized sub-package 200 may include the electronic components 205 disposed on an adhesive layer 211, where the adhesive layer 211 is disposed on a carrier 260 (or a first carrier). The electrical components 205 are substantially similar to the electrical components 105 of FIG. 1B. Note that the electrical components 205 may include any number of electrical components and any combination of different electrical components, such as capacitors, inductors, and so on. For one embodiment, the adhesive layer 211 may be a UV releasable tape, a double-sided release tape/film, and/or any other type of adhesive tapes/films. The carrier 260 may be any rigid carrier, which can be made from glass, stainless steel, etc.

Figure 2B:
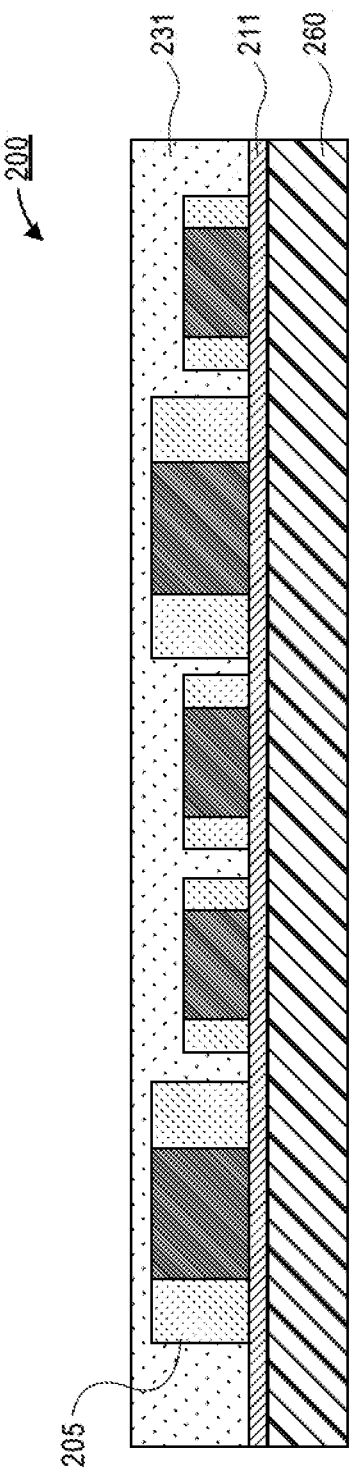

Referring now to FIG. 2B, a cross-sectional illustration of the modularized sub-package 200 with a mold layer 231 is shown, in accordance with an embodiment. In one embodiment, the modularized sub-package 200 may have the mold layer 231 disposed above and around the electrical components 205 and the adhesive layer 211. The mold layer 231 may be substantially similar to the mold layer 131 of FIG. 1B. The mold layer 231 may be formed using any suitable molding/encapsulating process.

Referring now to FIG. 2C, a cross-sectional illustration of the modularized sub-package 200 with top surfaces 205a of the electrical components 205 is shown, in accordance with an optional embodiment. In this embodiment, the modularized sub-package may include grinding (or etching/removing) the mold layer 231 to a desired thickness. For example, the mold layer 231 may be grinded down to expose one or more of the top surfaces 205a of the electrical components 205 based on this optional step of the overall process flow. The mold layer 231 may be removed using any known mold grinding process.

Referring now to FIG. 2D, a cross-sectional illustration of the modularized sub-package 200 with a carrier 261 (a second carrier) and an adhesive layer 211 is shown, in accordance with an embodiment. In one embodiment, the modularized sub-package 200 may include the carrier 260 and the adhesive layer 211, respectively, disposed above the top surface of the mold layer 231 and the electrical components 205. In some embodiments, the adhesive layer 211 may be disposed above the top surfaces of the electrical components 205 or disposed directly on one or more of the top surfaces of the electrical components 205 (i.e., the adhesive layer 211 may be directly coupled to one or more of the top surfaces of the electrical components 205 if the mold layer 231 was grinded down to expose such top surfaces).

Figure 2E:
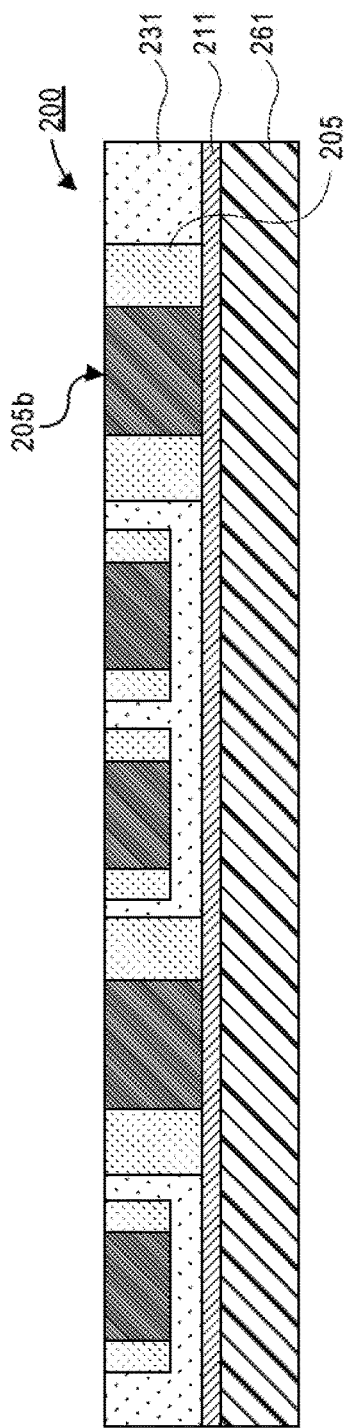

Referring now to FIG. 2E, a cross-sectional illustration of the modularized sub-package 200 with bottom surfaces 205b of the electrical components 205 is shown after the removal of the first carrier and the adhesive layer, in accordance with an embodiment. In one embodiment, the modularized sub-package 200 may be flipped over (i.e., turned over on the horizontal x-axis) to remove the first carrier (e.g., the carrier 260 of FIG. 2D) with the adhesive layer, as such the carrier 261 with the adhesive layer 211 are now below the electrical components 205. After removing the carrier and the adhesive layer, the bottom surfaces 205b of the electrical components 205 are exposed to enable coupling the pads of the electrical components 205 to another substrate, such as the RDL shown below in FIG. 2F.

Figure 2F:
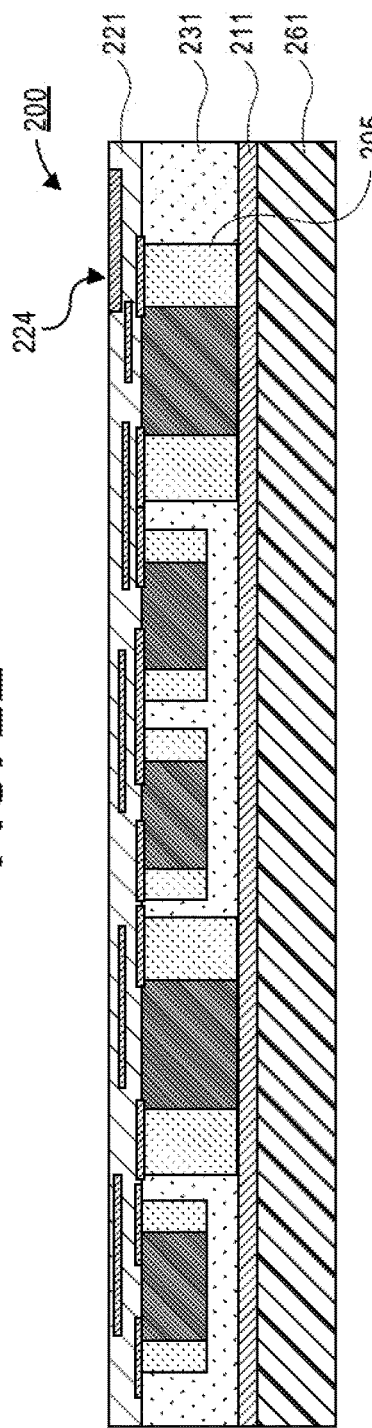

Referring now to FIG. 2F, a cross-sectional illustration of a modularized sub-package 200 with a RDL 221 is shown, in accordance with an embodiment. In one embodiment, the modularized sub-package 200 may include disposing the RDL 221 on the bottom surfaces of electronic components 205 and the mold layer 231. The RDL 221 may be substantially similar to the RDL 121 of FIG. 1B. In one embodiment, the RDL 221 may have one or more conductive pads 224 located on the top surface of the RDL 221. The conductive pad(s) 224 may be positioned on the outer edges of the RDL 221 to enable other components, such as dies, substrates, RDLs, modularized sub-packages, etc., to be coupled with the modularized sub-package 200 (e.g., as shown by the conductive pad 124 of FIG. 1A). Note that FIG. 2F only illustrates one conductive pad 224, however the RDL 221 may include any number of additional conductive pads that may be needed based on the desired packaging design.

Figure 2G:
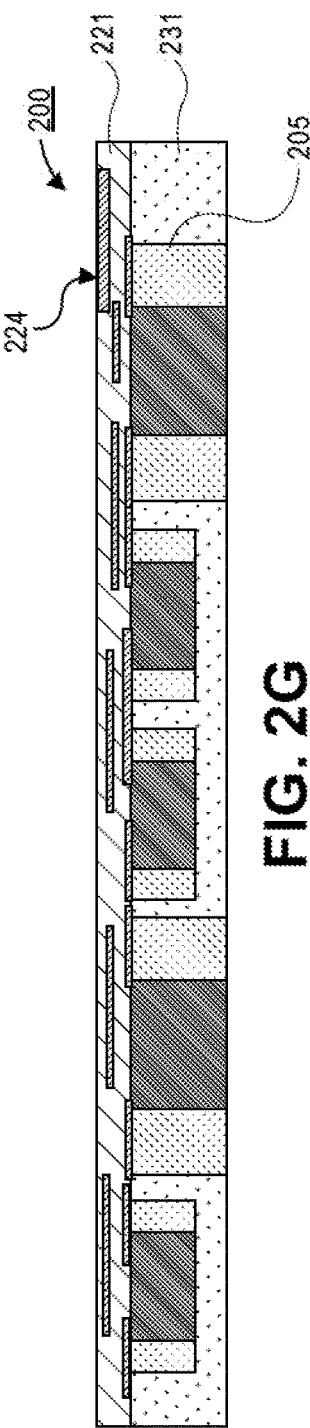

Referring now to FIG. 2G, a cross-sectional illustration of a modularized sub-package 200 is shown after the removal of the second carrier and the adhesive layer, in accordance with an embodiment. In one embodiment, the modularized sub-package 200 may include removing the carrier (e.g., the carrier 261 of FIG. 2F) and the adhesive layer to expose the top surfaces of the mold layer 231 and/or the electrical components 205. Note that, after this removal process, the modularized sub-package 200 of FIG. 2G is substantially similar to the modularized sub-package 150 of FIGS. 1A-1B. In some embodiments, the modularized sub-package 200 may now be (or disposed) with another system/package, such as coupling the modularized sub-package 200 to a stack of dies, a package substrate, and/or one or more modularized sub-packages (e.g., as shown in FIGS. 1A and 3).

Note that the modularized sub-package 200 as shown in FIGS. 2A-2G may include fewer or additional packaging components based on the desired packaging design.

Figure 3:
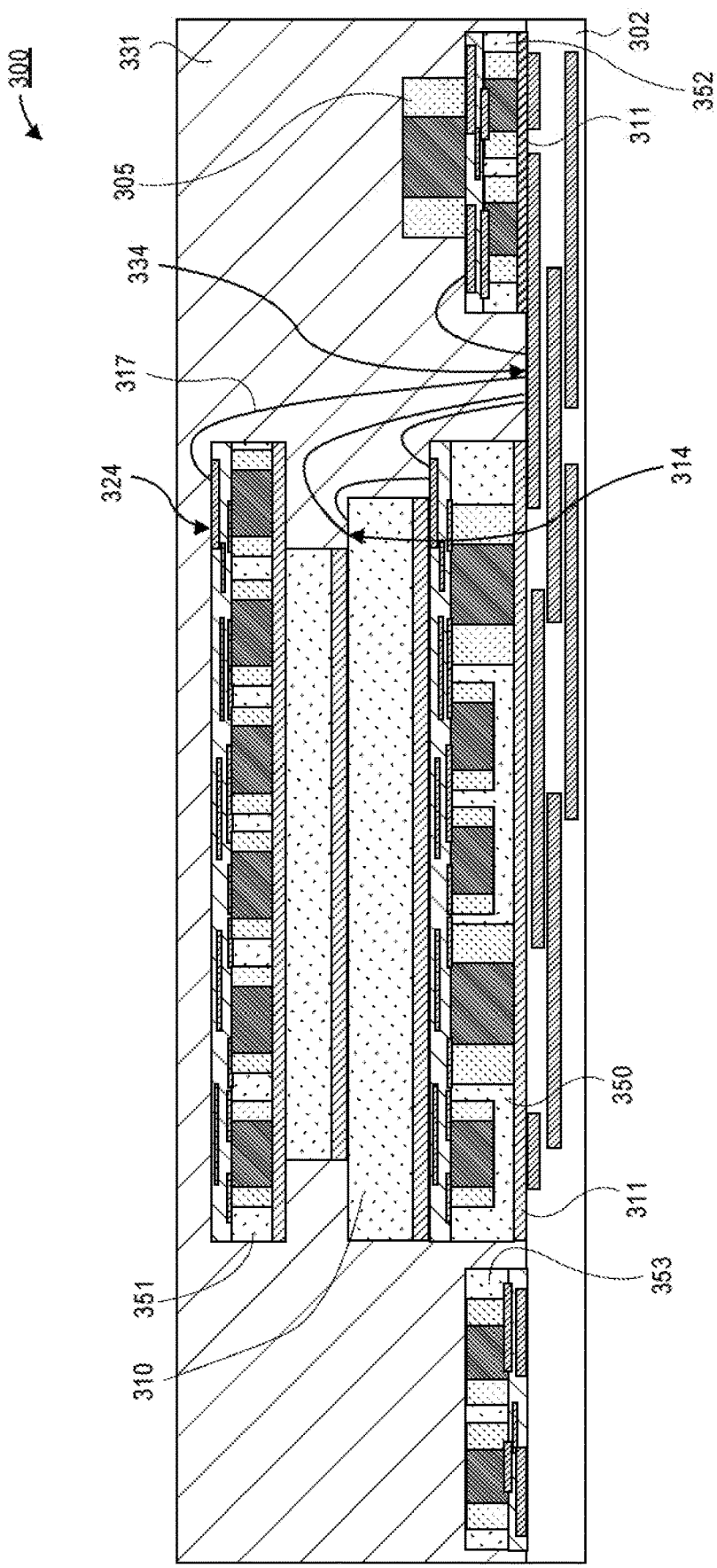
FIG. 3 is an illustration of a cross-sectional view of a SiP having a plurality of modularized sub-packages and a plurality of interconnects, according to one embodiment.

FIG. 3 is an illustration of a cross-sectional view of a SiP 300 having a plurality of modularized sub-packages 350-352, a stack of dies 310, a plurality of interconnects 317, and a mold layer 331, according to one embodiment. In particular, FIG. 3 illustrates one or more embodiments of modularized sub-packages 350-353 integrated into the SiP 300 with the interconnects 317 and the mold layer 331. The interconnects 317 may be wire bonding interconnects and substantially similar to the interconnects 117 of FIG. 1A. Additionally, the mold layer 331 may be disposed around and over the modularized sub-packages 350-352, the interconnects 317, the stacked dies 310, and the substrate 302. The mold layer 331 may be substantially similar to the mold layer 131 of FIG. 1A.

For some embodiments, the SiP 300 may be substantially similar to the SiP 100 of FIG. 1A, however the SiP 300 includes multiple sub-packages 350-353 disposed and coupled in a multiple, different manners as shown in FIG. 3. The modularized sub-packages 350-353 are substantially similar to the modularized sub-packages 150, 140, and 200 of FIGS. 1B, 1C, and 2G. As such, the components of the modularized sub-packages 350-352 including the RDLs, the mold layers, and the electrical components are substantially similar to the RDL 121, the mold layer 131, and the electrical components 105 of the modularized sub-package 150 of FIG. 1B.

In some embodiments, the SiP 300 includes the modularized sub-package 350 (or a first modularized sub-package) disposed on a substrate 302 coupled by an adhesive layer 311. The adhesive layer 311 is substantially similar to the adhesive layer 111 of FIG. 1A. In one embodiment, one or more stacked dies 310 with adhesive layers 311 are disposed on the RDL of the modularized sub-package 350. As shown in FIG. 3, the modularized sub-package 350 has a conductive pad 324 located on a top surface of an outer edge of the RDL. The conductive pad of the modularized sub-package 350 may be coupled to a conductive pad 314 of one die of the stacked dies 310 and to a conductive pad 334 of the substrate 302 by one or more interconnects 317.

For some embodiments, the SiP 300 further includes the modularized sub-package 351 (or a second modularized sub-package) disposed above the adhesive layer 311 and the stacked dies 310. The modularized sub-package 351 has the conductive pad 324 which may be coupled to the conductive pad 334 of the substrate 302. Additionally, in these embodiments, the SiP 300 also includes the modularized sub-package 352 (or a third modularized sub-package) disposed above the adhesive layer 311, which is directly on the top surface of the substrate 302. As shown in FIG. 3, the RDL of the modularized sub-package 352 enables coupling the electrical component 305 on the RDL to the electrical components 305 embedded in the mold layer of the modularized sub-package 352.

In some embodiments, one or more electrical components 305 may be disposed and coupled directly on the RDL of the modularized sub-package 352, where the RDL of the modularized sub-package 352 may also include the conductive pad 324 that may be coupled to the conductive pad 334 of the substrate 302 with one or more the interconnects 317. For one embodiment, the SiP 300 enables integrating the modularized sub-package 353 (or a fourth modularized sub-package) directly onto the top surface of the substrate 302 by coupling the conductive pads of the RDL of the modularized sub-package 353 directly to the conductive pads of the substrate 302. That is, unlike the modularized sub-packages 350-352, the modularized sub-package 353 may be flipped and thus the RDL of the modularized sub-package 353 may now be the bottommost layer (rather than topmost layers as shown with the RDLs of the modularized sub-packages 350-352). Accordingly, the modularized sub-packages 350-353 provide pre-tested modules that are subsequently assembled into the SiP 300, which thus increases yields and reduces the overall costs and scraps of the SiP 300.

In addition, the SiP 300 may integrate the modularized sub-packages 350-353 onto the package substrate 302— prior to disposing the mold layer 331 over the modularized sub-packages 350-353—where each of the modularized sub-packages 350-353 has a mold layer that encapsulates the respective electrical components 305. In some embodiments, each of these mold layers of the modularized sub-packages 350-353, including the mold layer 331, may include the same mold materials or different mold materials (i.e., each mold layer, including the mold layer 331, may each have different molding materials based on the desired packaging design/application and the characteristics of the encapsulated electrical components 305).

Note that the SiP 300 and the modularized sub-packages 350-353 as shown in FIG. 3 may include fewer or additional packaging components based on the desired packaging design.

Figure 4:
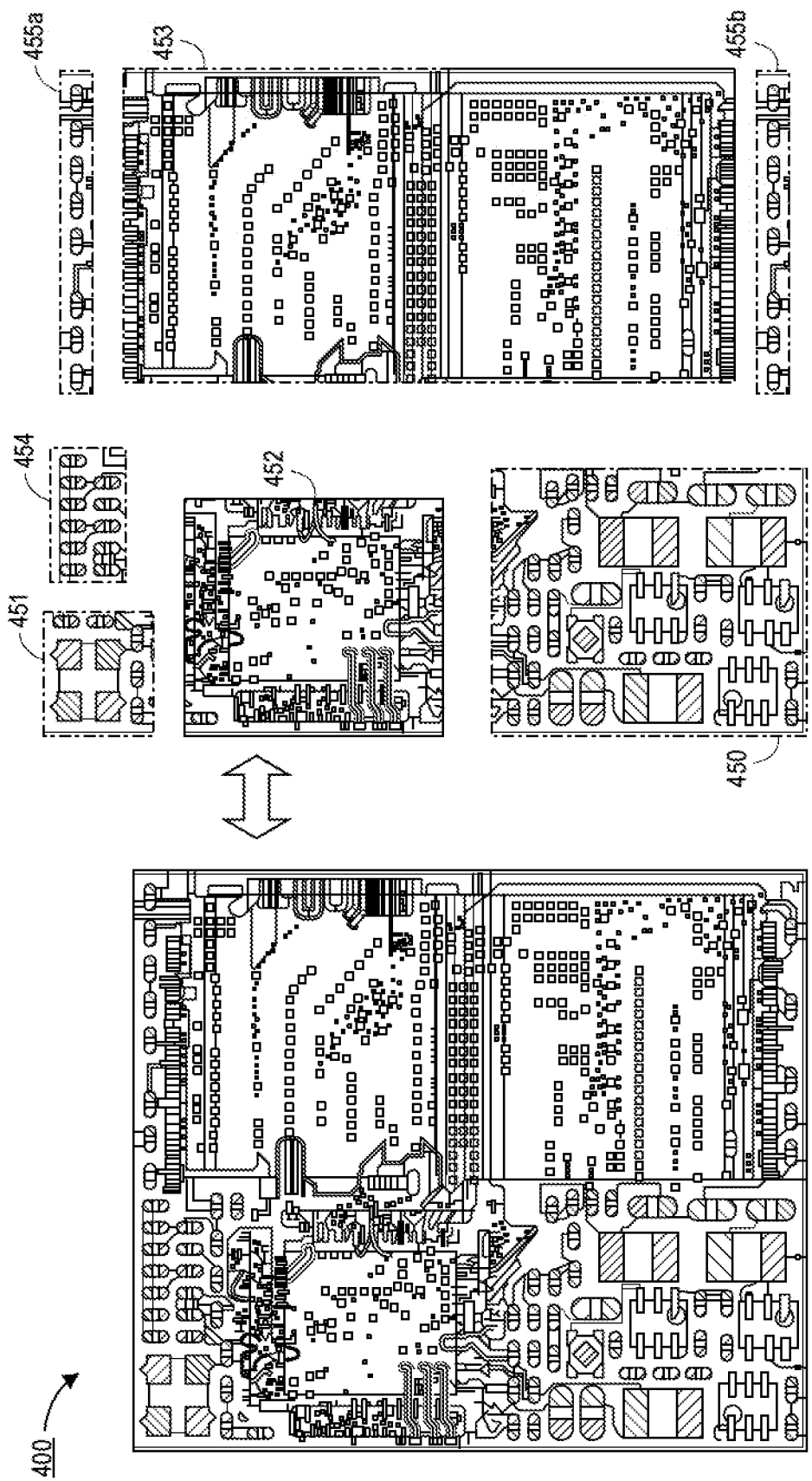
FIG. 4 is an illustration of a plan view of a SiP system having a plurality of modularized sub-packages, according to one embodiment.

FIG. 4 is an illustration of a plan view of a SiP system 400 having a plurality of modularized sub-packages 450-455a-b, according to one embodiment. In particular, FIG. 4 illustrates the SiP system 400 on the left-hand side, and multiple different modularized sub-packages 450-455a-b on the right-hand side, where these modularize sub-package 450-455a-b may be separated, tested, integrated, and then interconnected (or coupled) to form the overall SiP system 400 using, for example, wire bonding and/or ribbon bonding interconnects (e.g., the interconnects 317 of FIG. 3).

As shown in FIG. 4, the SiP system 400 may have the modularized sub-package 450-455a-b (i.e., array of components/modules) that may be placed together and then utilized as whole packages (or system) or diced into smaller units based on the utilization, space, and design. For example, the SiP system 400 illustrates the modularized sub-package 450-455a-b that are integrated (or picked and placed) into such SiP system 400 in full arrays or partial arrays as needed. That is, as shown in FIG. 4, multiple different packages/modules (or sub-assemblies), such as the modularized sub-package 450-455a-b, may be placed together to create a full SiP system, such as the SiP system 400, where these modules may be additionally turned into other/further sub-assembled modules (or units) and/or used in other SiP systems, applications, designs, and/or packages.

For example, the modularized sub-package 450 may be a power module; the modularized sub-package 451 may be a sync clock module; the modularized sub-package 452 may be a logic module; the modularized sub-package 453 may be a memory module; and the modularized sub-packages 454 and 455a-b may be one or more passive modules. These embodiments of the modularized sub-packages may be applied and integrated in any type of packaging system, such as multi-chip modules (MCMs) and/or SiPs (e.g., a solid state drive (SSD) package, a radio-frequency (RF) package, a Broadband package, etc.), where these systems may be broken up (or diced) into several sub-systems (or modularized sub-packages) (e.g., a crystal (XTAL) sub-package, an application specific integrated circuit (ASIC) sub-package, a non-volatile memory (NVM) sub-package, one or more passive sub-packages that may be customized based on the utilization and/or design, etc.).

Note that the SiP 400 and the modularized sub-packages 450-455a-b as shown in FIG. 4 may include fewer or additional packaging components based on the desired packaging design.

Figure 5:
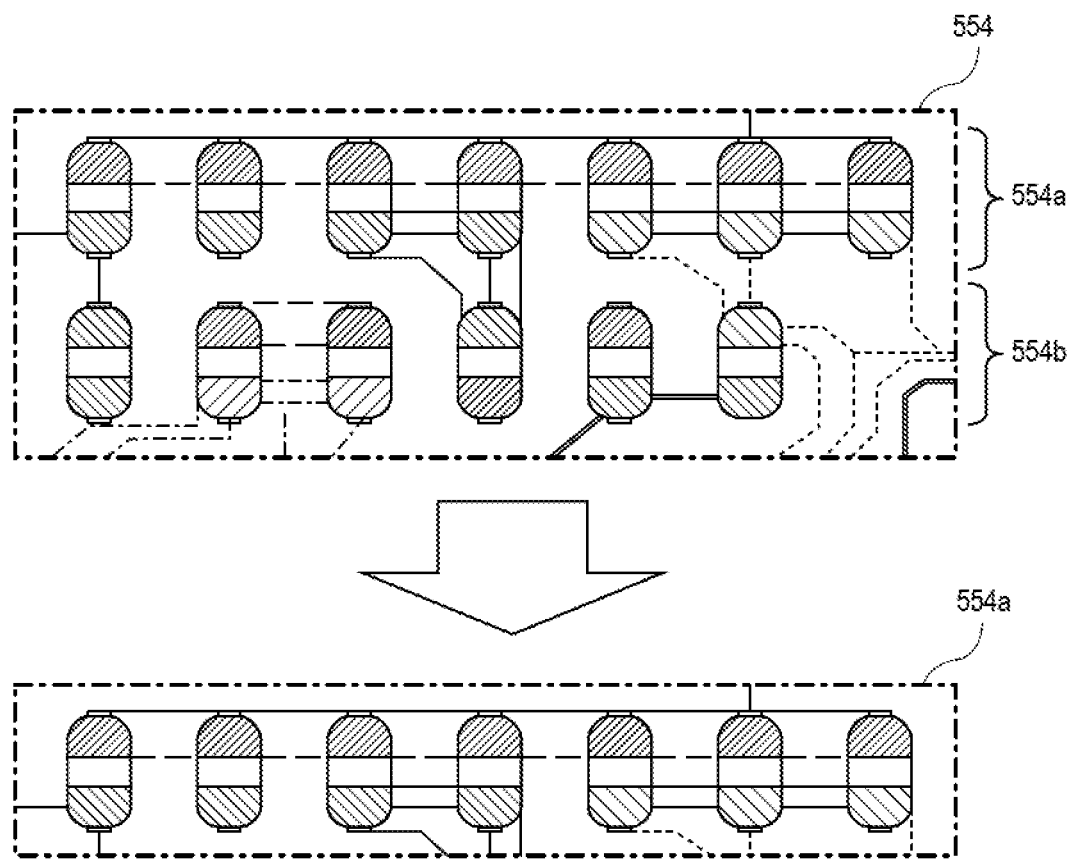
FIG. 5 is an illustration of a plan view of a modularized sub-package that may be used as one or more modularized packages, according to one embodiment.

FIG. 5 is an illustration of a plan view of a modularized sub-package 554, according to one embodiment. The modularized sub-package 554 is substantially similar to the modularized sub-package 454 of FIG. 4. For example, the modularized sub-package 554 may be a passive module that may be used as one or more modularized units 554a-b, according to one embodiment. In this example, the modularized sub-package 554 may be a two-in-one passive module having two passive modularized units 554a-b. In addition, as shown by the arrow of FIG. 5, the modularized sub-package 554 may be diced (or separated) into two separate passive units 554a and 554b, which may be diced using any cutting/lasering process. Note that this cutting process, as shown in FIG. 5, may be implemented to any of the modularized sub-packages described herein. Also note that the modularized sub-package 554 as shown in FIG. 5 may include fewer or additional packaging components based on the desired packaging design.

Figure 6:
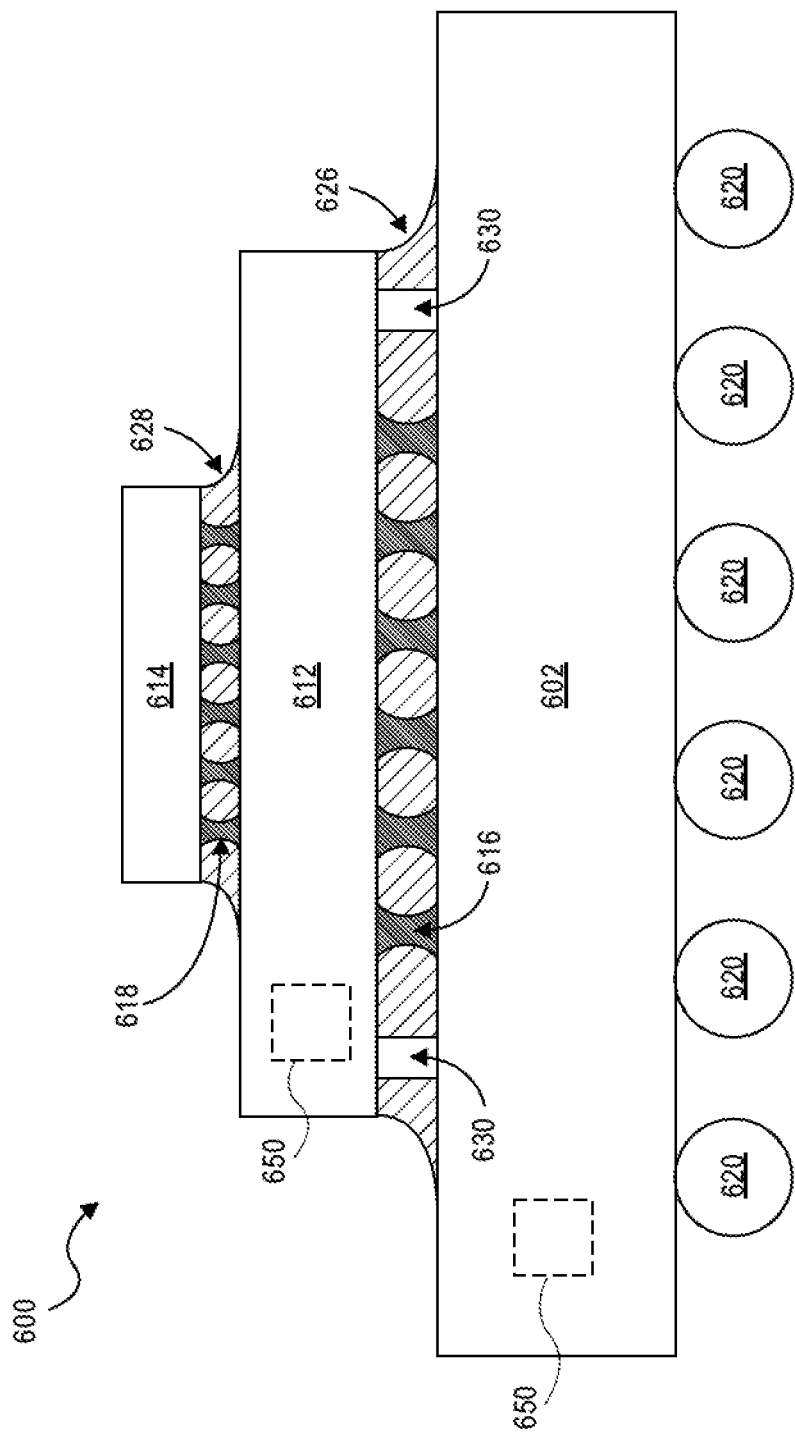
FIG. 6 is an illustration of a cross-sectional view of a semiconductor packaged system including a die, a substrate, a package substrate, and one or more modularized sub-packages, according to one embodiment.

FIG. 6 is an illustration of a cross-sectional view of a semiconductor packaged system 600 including a die 614, a substrate 612, a package substrate 602, and one or more modularized sub-packages 650, according to one embodiment. FIG. 6 illustrates the semiconductor package system 600 including the die 614, the substrate 612 (or an interposer), interconnect structures (e.g., the plurality of bumps disposed below the die 614 and the substrate 612), and the package substrate 602, where the substrate 612 and/or the package substrate 602 may further include the modularized sub-packages 650. In these embodiments, the one or more modularized sub-packages 650 may include one or more modularized sub-packages coupled by a plurality of interconnects, where the one or more modularized sub-packages may include a redistribution layer, a plurality of electronic components, and a mold layer, according to one embodiment.

For one embodiment, the semiconductor package 600 may implement the substrate 612 and/or the package substrate 602 to include the modularized sub-packages 650 (as the modularized sub-packages may be similar to the modularized sub-package described herein) having stacked dies disposed above/between/below modularized sub-packages and coupled by wire/ribbon bonding interconnects, according to one embodiment. For one embodiment, the modularized sub-packages 650 of the substrate 612 and/or the package substrate 602 may be substantially similar to the modularized sub-packages 150, 200, 350-353 and 450-455a-b of FIGS. 1A-4. Note that the semiconductor package 600 is not limited to the illustrated semiconductor packaged system, and thus may be designed/formed with fewer, alternate, or additional packaging components and/or with different interconnecting structures.

According to one embodiment, the semiconductor package 600 is merely one example of an embodiment of a semiconductor packaged system. For one embodiment, the semiconductor package 600 may include a land grid array (LGA) package and/or a pin grid array (PGA) package. For one embodiment, a die 614 (or an IC die) is coupled to a substrate 612 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 614, the substrate 612, and the package substrate 602 may be coupled using anisotropic conductive film (ACF). For one embodiment, the substrate 612 may be, but is not limited to, a silicon interposer and/or a die with through silicon vias (TSVs). For an alternate embodiment, the semiconductor package 600 may omit the interposer/substrate 612.

For some embodiments, the semiconductor package 600 may have the die 614 disposed on the interposer 612, where both the stacked die 614 and interposer 612 are disposed on a package substrate 602. According to some embodiments, the package substrate 602 may include, but is not limited to, a package, a substrate, a PCB, and a motherboard. For one embodiment, the package substrate 602 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 602. For one embodiment, the PCB 602 may also include conductive layers that comprise copper lines/traces, metallic pads, vias, via pads, planes, and/or holes.

For one embodiment, the die 614 may include, but is not limited to, a semiconductor die, an electronic device (e.g., a wireless device), an integrated circuit, a central processing unit (CPU), a microprocessor, a PCH, a memory, and a FPGA. The die 614 may be formed from a material such as silicon and have circuitry thereon that is to be coupled to the interposer 612. Although some embodiments are not limited in this regard, the package substrate 602 may in turn be coupled to another body, for example, a computer motherboard. One or more connections between the package substrate 602, the interposer 612, and the die 614—e.g., including some or all of bumps 616, 618, and 620—may include one or more interconnect structures and underfill layers 626 and 628. In some embodiments, these interconnect structures (or connections) may variously comprise an alloy of nickel, palladium, and tin (and, in some embodiments, Cu).

Connections between the package substrate 602 and another body may be made using any suitable structure, such as the illustrative bumps 620 shown. The package substrate 602 may include a variety of electronic structures formed thereon or therein. The interposer 612 may also include electronic structures formed thereon or therein, which may be used to couple the die 614 to the package substrate 602. For one embodiment, one or more different materials may be used for forming the package substrate 602 and the interposer 612. In certain embodiments, the package substrate 602 is an organic substrate made up of one or more layers of polymer base material, with conducting regions for transmitting signals. In certain embodiments, the interposer 612 is made up of a ceramic base material including metal regions for transmitting signals. Although some embodiments are not limited in this regard, the semiconductor package 600 may include gap control structures 630—e.g., positioned between the package substrate 602 and the interposer 612. Such gap control structures 630 may mitigate a change in the height of the gap between the package substrate 602 and the interposer 612, which otherwise might occur during reflowing while die 614 is attached to interposer 612. Note that the semiconductor package 600 includes an underfill material 628 between the interposer 612 and the die 614, and an underflow material 626 between the package substrate 602 and the interposer 612. For one embodiment, the underfill materials (or layers) 626 and 628 may be one or more polymers that are injected between the layers. For other embodiments, the underfill materials may be molded underfills (MUF).

Note that the semiconductor package 600 may include fewer or additional packaging components based on the desired packaging design.

Figure 7:
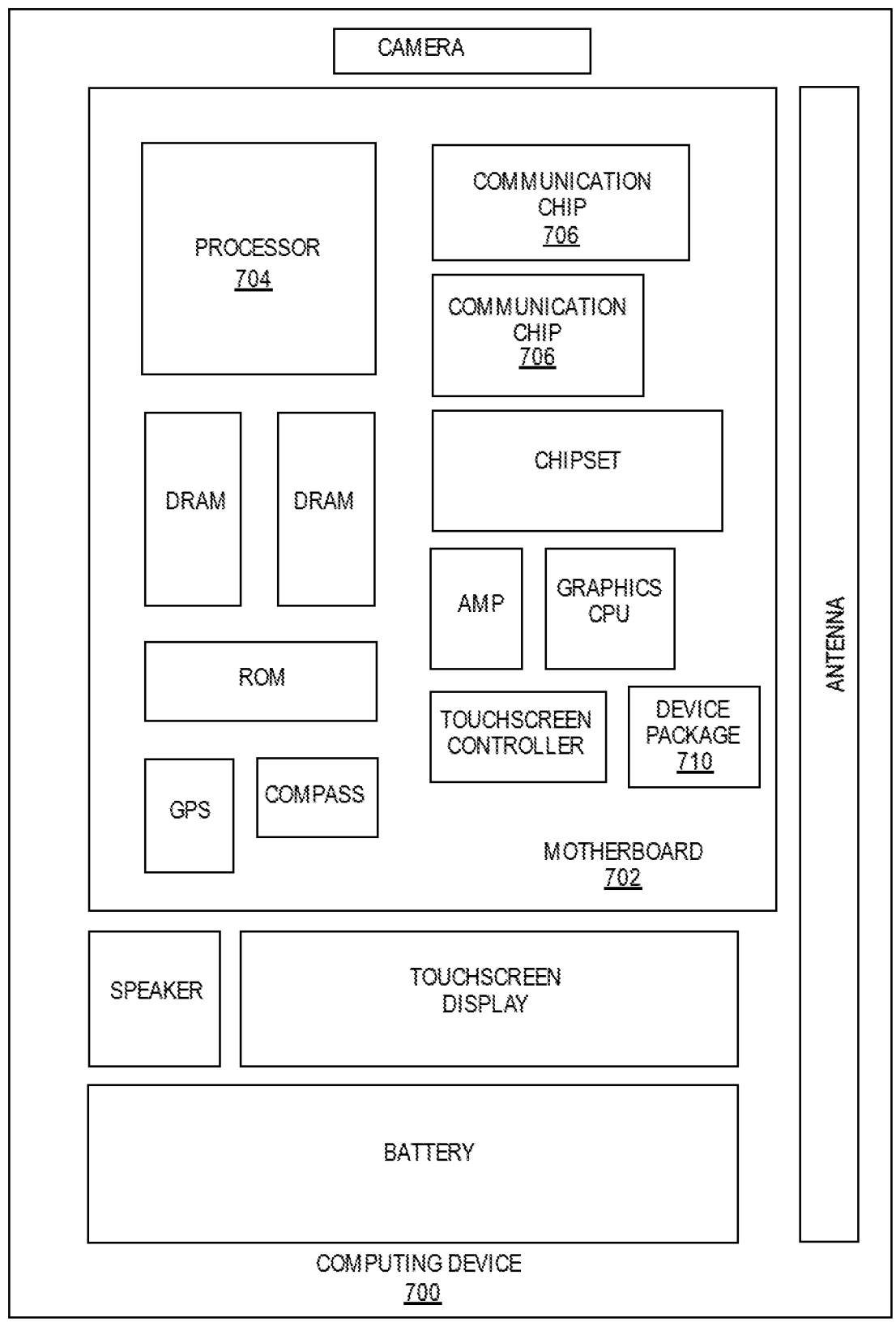
FIG. 7 is an illustration of a schematic block diagram illustrating a computer system having a SiP with one or more modularized sub-packages using a plurality of interconnects, according to one embodiment.

FIG. 7 is an illustration of a schematic block diagram illustrating a computer system 700 that utilizes a device package 710 (or a SiP) having a stack of dies, a plurality of modularized sub-packages, a plurality of mold layers, and a plurality of interconnects, according to one embodiment. FIG. 7 illustrates an example of computing device 700. Computing device 700 houses motherboard 702. For one embodiment, motherboard 702 may be similar to the substrate 102, 302, and 602 of FIGS. 1A, 3, and 6. Motherboard 702 may include a number of components, including but not limited to processor 704, device package 710 (or SiP), and at least one communication chip 706. Processor 704 is physically and electrically coupled to motherboard 702. For some embodiments, at least one communication chip 706 is also physically and electrically coupled to motherboard 702. For other embodiments, at least one communication chip 706 is part of processor 704.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 706 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

Processor 704 of computing device 700 includes an integrated circuit die packaged within processor 704. Device package 710 may be, but is not limited to, a SiP, a substrate, a package substrate, and/or a PCB. Device package 710 may include a SiP having one or more modularized sub-packages coupled by a plurality of interconnects, where the one or more modularized sub-packages may include a redistribution layer, a plurality of electronic components, and a mold layer (e.g., as illustrated in FIGS. 1-4)—or any other components from the figures described herein. The device package 710 may thus implement the SiP, the modularized sub-packages, and/or the modularized units described herein to mitigate (or avoid) using solder interconnects with the computing device 700.

Note that device package 710 may be a single component/device, a subset of components, and/or an entire system, as the materials, features, and components may be limited to device package 710 and/or any other component of the computing device 700 that may need the SiPs, the modularized sub-packages, and/or the modularized units (e.g., the motherboard 702, the processor 704, and/or any other component of the computing device 700 may need the SiPs (or components/structures) as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 706 also includes an integrated circuit die packaged within the communication chip 706. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a system in package (SiP), comprising: a package substrate; a first modularized sub-package over the package substrate, wherein the first modularized sub-package includes a plurality of electrical components, a first mold layer, and a redistribution layer; a stack of dies over the package substrate, wherein the first modularized sub-package is disposed between the stack of dies; and a plurality of interconnects coupled to the stack of dies, the first modularized sub-package, and the package substrate, wherein the redistribution layer of the first modularized sub-package couples the stack of dies to the package substrate with the plurality of interconnects.

In example 2, the subject matter of example 1 can optionally include that the redistribution layer of the first modularized sub-package couples the plurality of electrical components to the stack of dies and the package substrate without a solder interconnect.

In example 3, the subject matter of examples 1-2 can optionally include a second mold layer over and around the stack of dies, the first modularized sub-package, the plurality of interconnects, and the package substrate.

In example 4, the subject matter of examples 1-3 can optionally include that the first modularized sub-package has the plurality of electrical components on the redistribution layer, wherein the first mold layer is over and around the plurality of electrical components and the redistribution layer, and wherein the redistribution layer is over the plurality of electrical components.

In example 5, the subject matter of examples 1-4 can optionally include a first conductive pad on a top surface of the redistribution layer of the first modularized sub-package, wherein the first conductive pad is located on an outer edge of the redistribution layer; a plurality of second conductive pads on a top surface of the package substrate; and a plurality of third conductive pads on top surfaces of the stack of dies.

In example 6, the subject matter of examples 1-5 can optionally include that the first conductive pad couples one or more of the third conductive pads to one or more of the second conductive pads with the plurality of interconnects; and wherein one or more of the third conductive pads are coupled directly to one or more of the second conductive pads with the plurality of interconnects.

In example 7, the subject matter of examples 1-6 can optionally include that a plurality of adhesive layers coupled to the stack of dies, wherein the plurality of adhesive layers has a first adhesive layer that couples the stack of dies to the top surface of the package substrate, and wherein the plurality of adhesive layers has a second adhesive layer disposed over the redistribution layer of the first modularized sub-package, and a third adhesive layer disposed below the first modularized sub-package.

In example 8, the subject matter of examples 1-7 can optionally include that the plurality of electrical components include passive components or integrated circuit (IC) dies, and wherein the plurality of interconnects include wire bonds or ribbon bonds.

In example 9, the subject matter of examples 1-8 can optionally include a second modularized sub-package over a first adhesive layer on the top surface of the package substrate, wherein a first electrical component is directly coupled on a top surface of the second modularized sub-package; a third modularized sub-package over the plurality of adhesive layers, the stack of dies, the first modularized sub-package, and the package substrate, wherein the second and third modularized sub-packages are coupled to the package substrate with the plurality of interconnects; and a fourth modularized sub-package directly on the top surface of the package substrate, wherein a first redistribution layer of the fourth modularized sub-package is coupled directly to the package substrate.

Example 10 is a method of forming a semiconductor package, comprising: disposing a first modularized sub-package over a package substrate, wherein the first modularized sub-package includes a plurality of electrical components, a first mold layer, and a redistribution layer; disposing a stack of dies over the package substrate, wherein the first modularized sub-package is disposed between the stack of dies; and coupling a plurality of interconnects to the stack of dies, the first modularized sub-package, and the package substrate, wherein the redistribution layer of the first modularized sub-package couples the stack of dies to the package substrate with the plurality of interconnects.

In example 11, the subject matter of example 10 can optionally include that prior to disposing the first modularized sub-package over the package substrate, further comprising forming the first modularized sub-package, wherein forming the first modularized sub-package further comprises: disposing the plurality of electrical components over a first carrier, wherein the plurality of electrical components are coupled to the carrier with a fourth adhesive layer; disposing the first mold layer over and around the plurality of electrical components and the fourth adhesive layer; disposing a second carrier over the mold layer, the plurality of electrical components, and the fourth adhesive layer, wherein the second carrier is coupled to the first mold layer with a fifth adhesive layer; flipping the first carrier over the plurality of electrical components, the first mold layer, and the second carrier, wherein the first carrier and the fourth adhesive layer are removed to expose bottom surfaces of the plurality of electrical components; disposing the redistribution layer over the exposed bottom surfaces of the plurality electrical components, the first mold layer, and the second carrier, wherein the redistribution layer is coupled to the plurality of electrical components; and removing the second carrier and the fifth adhesive layer to expose a surface of the first mold layer.

In example 12, the subject matter of examples 10-11 can optionally include disposing a second mold layer over and around the stack of dies, the first modularized sub-package, the plurality of interconnects, and the package substrate.

In example 13, the subject matter of examples 10-12 can optionally include that the first modularized sub-package has the plurality of electrical components on the redistribution layer, wherein the first mold layer is over and around the plurality of electrical components and the redistribution layer, wherein the redistribution layer is over the plurality of electrical components, and wherein the redistribution layer of the first modularized sub-package couples the plurality of electrical components to the stack of dies and the package substrate without a solder interconnect.

In example 14, the subject matter of examples 10-13 can optionally include disposing a first conductive pad on a top surface of the redistribution layer of the first modularized sub-package, wherein the first conductive pad is located on an outer edge of the redistribution layer; disposing a plurality of second conductive pads on a top surface of the package substrate; and disposing a plurality of third conductive pads on top surfaces of the stack of dies.

In example 15, the subject matter of examples 10-14 can optionally include that the first conductive pad couples one or more of the third conductive pads to one or more of the second conductive pads with the plurality of interconnects; and wherein one or more of the third conductive pads are coupled directly to one or more of the second conductive pads with the plurality of interconnect.

In example 16, the subject matter of examples 10-15 can optionally include coupling a plurality of adhesive layers to the stack of dies, wherein the plurality of adhesive layers has a first adhesive layer that couples the stack of dies to the top surface of the package substrate, and wherein the plurality of adhesive layers has a second adhesive layer disposed over the redistribution layer of the first modularized sub-package, and a third adhesive layer disposed below the first modularized sub-package.

In example 17, the subject matter of examples 10-16 can optionally include that the plurality of electrical components include passive components or IC dies, and wherein the plurality of interconnects include wire bonds or ribbon bonds.

In example 18, the subject matter of examples 10-17 can optionally include disposing a second modularized sub-package over a first adhesive layer on the top surface of the package substrate, wherein a first electrical component is directly coupled on a top surface of the second modularized sub-package; disposing a third modularized sub-package over the plurality of adhesive layers, the stack of dies, the first modularized sub-package, and the package substrate, wherein the second and third modularized sub-packages are coupled to the package substrate with the plurality of interconnects; and disposing a fourth modularized sub-package directly on the top surface of the package substrate, wherein a first redistribution layer of the fourth modularized sub-package is coupled directly to the package substrate.

Example 19 is a semiconductor packaging system, comprising: a package substrate; a first modularized sub-package over the package substrate, wherein the first modularized sub-package includes a plurality of electrical components, a first mold layer, and a redistribution layer; a stack of dies with a plurality of adhesive layers over the package substrate, wherein the first modularized sub-package is between the stack of dies and the package substrate; a plurality of interconnects coupled to the stack of dies, the first modularized sub-package, and the package substrate, wherein the redistribution layer of the first modularized sub-package couples the stack of dies to the package substrate with the plurality of interconnects; a second modularized sub-package over a first adhesive layer on a top surface of the package substrate, wherein a first electrical component is directly coupled on a top surface of the second modularized sub-package; a third modularized sub-package over the plurality of adhesive layers, the stack of dies, the first modularized sub-package, and the package substrate, wherein the second and third modularized sub-packages are coupled to the top surface of the package substrate with the plurality of interconnects; and a fourth modularized sub-package directly on the top surface of the package substrate, wherein the fourth modularized sub-package has a first redistribution layer, and wherein the first redistribution layer has a top surface coupled directly to the top surface of the package substrate.

In example 20, the subject matter of example 19 can optionally include that the redistribution layer of the first modularized sub-package couples the plurality of electrical components to the stack of dies and the package substrate without a solder interconnect.

In example 21, the subject matter of examples 19-20 can optionally include a second mold layer over and around the stack of dies, the first modularized sub-package, the plurality of interconnects, and the package substrate.

In example 22, the subject matter of examples 19-21 can optionally include that the first modularized sub-package has the plurality of electrical components on the redistribution layer, wherein the first mold layer is over and around the plurality of electrical components and the redistribution layer, and wherein the redistribution layer is over the plurality of electrical components.

In example 23, the subject matter of examples 19-22 can optionally include that a first conductive pad on a top surface of the redistribution layer of the first modularized sub-package, wherein the first conductive pad is located on an outer edge of the redistribution layer; a plurality of second conductive pads on a top surface of the package substrate; and a plurality of third conductive pads on top surfaces of the stack of dies.

In example 24, the subject matter of examples 19-23 can optionally include that the first conductive pad couples one or more of the third conductive pads to one or more of the second conductive pads with the plurality of interconnects, wherein one or more of the third conductive pads are coupled directly to one or more of the second conductive pads with the plurality of interconnects, wherein the plurality of electrical components include passive components or IC dies, and wherein the plurality of interconnects include wire bonds or ribbon bonds.

In example 25, the subject matter of examples 19-24 can optionally include that a plurality of adhesive layers coupled to the stack of dies, wherein the plurality of adhesive layers has a first adhesive layer that couples the stack of dies to the top surface of the package substrate, and wherein the plurality of adhesive layers has a second adhesive layer disposed over the redistribution layer of the first modularized sub-package, and a third adhesive layer disposed below the first modularized sub-package; a second modularized sub-package over a first adhesive layer on the top surface of the package substrate, wherein a first electrical component is directly coupled on a top surface of the second modularized sub-package; a third modularized sub-package over the plurality of adhesive layers, the stack of dies, the first modularized sub-package, and the package substrate, wherein the second and third modularized sub-packages are coupled to the package substrate with the plurality of interconnects; and a fourth modularized sub-package directly on the top surface of the package substrate, wherein a first redistribution layer of the fourth modularized sub-package is coupled directly to the package substrate.

Example 26 is a modularized sub-package, comprising: a plurality of electrical components on a redistribution layer; a mold layer over the plurality of electrical components and the redistribution layer, wherein the plurality of electrical components have top surfaces and bottom surfaces that are opposite to the top surfaces, wherein the bottom surfaces of the electrical components are coupled to a bottom surface of the redistribution layer, and wherein the top surfaces of the electrical components are parallel to a surface of the mold layer; and a conductive pad on the redistribution layer, wherein the conductive pad is located on an outer edge of the redistribution layer, and wherein the conductive pad has an exposed surface that is substantially planar to a top surface of the redistribution layer.

In example 27, the subject matter of example 26 can optionally include that the surface of the mold layer is positioned below the top surfaces of the plurality of electrical components.

In example 28, the subject matter of examples 26-27 can optionally include that the surface of the mold layer is substantially planar to one or more of the top surfaces of the plurality of electrical components.

In example 29, the subject matter of examples 26-28 can optionally include that the one or more top surfaces of the plurality of electrical components are exposed surfaces that are not covered by the mold layer.

In example 30, the subject matter of examples 26-29 can optionally include that the redistribution layer is a dual-sided redistribution layer.

In example 31, the subject matter of examples 26-30 can optionally include a first electrical component directly coupled on the top surface of the redistribution layer.

In example 32, the subject matter of examples 26-31 can optionally include a package substrate having a top surface, wherein the top surface of the package substrate is coupled to the conductive pad of the redistribution layer by an interconnect, or wherein the top surface of the package substrate is coupled directly to the top surface of the redistribution layer.

In example 33, the subject matter of examples 26-32 can optionally include that the plurality of electrical components include passive components or integrated circuit (IC) dies, wherein the plurality of interconnects include wire bonds or ribbon bonds, and wherein the redistribution layer couples the plurality of electrical components to the package substrate without a solder interconnect.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A system in package (SiP), comprising:
   a package substrate;
   a modularized sub-package over the package substrate, wherein the modularized sub-package includes a plurality of electrical components, a first mold layer, and a redistribution layer, wherein the plurality of electrical components are in direct contact with the redistribution layer;
   a first die and a second die over the package substrate, wherein the modularized sub-package is disposed between the first die and the second die; and
   a plurality of interconnects coupled to the first and second dies, the modularized sub-package, and the package substrate, wherein the redistribution layer of the modularized sub-package couples at least one of the first or second dies to the package substrate with the plurality of interconnects, and wherein the plurality of interconnects comprises a first wire or ribbon bond between the one of the first or second dies to the redistribution layer, and a second wire or ribbon between the redistribution layer and the package substrate.

2. The SiP of claim 1, wherein the redistribution layer of the modularized sub-package couples the plurality of electrical components to the at least one of the first or second dies and the package substrate without a solder interconnect.

3. The SiP of claim 1, further comprising a second mold layer over and around the first and second dies, the modularized sub-package, the plurality of interconnects, and the package substrate.

4. The SiP of claim 1, wherein the modularized sub-package has the plurality of electrical components coupled directly to a bottom surface of the redistribution layer, wherein the first mold layer is over and around the plurality of electrical components and the bottom surface of the redistribution layer, and wherein the redistribution layer is over the plurality of electrical components.

5. The SiP of claim 1, further comprising:
   a first conductive pad on a top surface of the redistribution layer of the modularized sub-package, wherein the first conductive pad is located on an outer edge of the redistribution layer;
   a plurality of second conductive pads on a top surface of the package substrate; and
   a plurality of third conductive pads on top surfaces of the first and second dies.

6. The SiP of claim 5, wherein the first conductive pad couples one or more of the third conductive pads to one or more of the second conductive pads with the plurality of interconnects, and wherein one or more of the third conductive pads are coupled directly to one or more of the second conductive pads with the plurality of interconnects.

7. The SiP of claim 5, further comprising a plurality of adhesive layers coupled to the first and second dies, wherein the plurality of adhesive layers has a first adhesive layer that couples the second die to the top surface of the package substrate, wherein the plurality of adhesive layers has a second adhesive layer that couples the first die to the top surface of the redistribution layer of the modularized sub-package, and wherein the plurality of adhesive layers has a third adhesive layer that couples the second die to a surface of the mold layer of the first modularized sub-package.

8. The SiP of claim 1, wherein the plurality of electrical components include passive components or IC dies.

9. The SiP of claim 7, wherein the plurality of electrical components have top surfaces and bottom surfaces that are opposite to the top surfaces, wherein the bottom surfaces of the electrical components are coupled to the bottom surface of the redistribution layer, and wherein the top surfaces of the electrical components are parallel to a surface of the mold layer, wherein the first conductive pad has an exposed surface that is substantially planar to the top surface of the redistribution layer, and wherein the redistribution layer is a dual-sided redistribution layer.

10. The SiP of claim 9, wherein the surface of the mold layer is positioned below the top surfaces of the plurality of electrical components, or wherein the surface of the mold layer is substantially planar to one or more of the top surfaces of the plurality of electrical components.

11. A SiP, comprising:
a package substrate;
a first modularized sub-package over the package substrate, wherein the first modularized sub-package includes a plurality of electrical components, a first mold layer, and a redistribution layer;
a stack of dies with a plurality of adhesive layers over the package substrate, wherein the first modularized sub-package is between the stack of dies and the package substrate;
a plurality of interconnects coupled to the stack of dies, the first modularized sub-package, and the package substrate, wherein the redistribution layer of the first modularized sub-package couples the stack of dies to the package substrate with the plurality of interconnects;
a second modularized sub-package over a first adhesive layer on a top surface of the package substrate, wherein a first electrical component is directly coupled on a top surface of the second modularized sub-package;
a third modularized sub-package over the plurality of adhesive layers, the stack of dies, the first modularized sub-package, and the package substrate, wherein the second and third modularized sub-packages are coupled to the top surface of the package substrate with the plurality of interconnects; and
a fourth modularized sub-package directly on the top surface of the package substrate, wherein the fourth modularized sub-package has a first redistribution layer, and wherein the first redistribution layer has a top surface coupled directly to the top surface of the package substrate.

12. The SiP of claim 11, wherein the redistribution layer of the first modularized sub-package couples the plurality of electrical components to the stack of dies and the package substrate without a solder interconnect, and wherein the first, second, third, and fourth modularized sub-packages are coupled to the stack of dies and the package substrate without the solder interconnect.

13. The SiP of claim 11, further comprising a second mold layer over and around the stack of dies, the first, second, third, and fourth modularized sub-packages, the plurality of interconnects, and the package substrate.

14. The SiP of claim 11, wherein the first modularized sub-package has the plurality of electrical components on the redistribution layer, wherein the first mold layer is over and around the plurality of electrical components and the redistribution layer, and wherein the redistribution layer is over the plurality of electrical components.

15. The SiP of claim 11, further comprising:
a first conductive pad on a top surface of the redistribution layer of the first modularized sub-package, wherein the first conductive pad is located on an outer edge of the redistribution layer;
a plurality of second conductive pads on the top surface of the package substrate; and
a plurality of third conductive pads on top surfaces of the stack of dies.

16. The SiP of claim 15, wherein the first conductive pad couples one or more of the third conductive pads to one or more of the second conductive pads with the plurality of interconnects, wherein one or more of the third conductive pads are coupled directly to one or more of the second conductive pads with the plurality of interconnects, wherein the plurality of electrical components include passive components or IC dies, and wherein the plurality of interconnects include wire bonds or ribbon bonds.

17. The SiP of claim 15, wherein the plurality of electrical components have top surfaces and bottom surfaces that are opposite to the top surfaces, wherein the bottom surfaces of the electrical components are coupled to the bottom surface of the redistribution layer of the first modularized sub-package, wherein the top surfaces of the plurality of electrical components are parallel to a surface of the mold layer, wherein the first conductive pad has an exposed surface that is substantially planar to the top surface of the redistribution layer of the first modularized sub-package, wherein the redistribution layer of the first modularized sub-package is a dual-sided redistribution layer, and wherein the surface of the mold layer is positioned below the top surfaces of the plurality of electrical components, or the surface of the mold layer is substantially planar to one or more of the top surfaces of the plurality of electrical components.

18. A system in package (SiP), comprising:
a package substrate;
a modularized sub-package over the package substrate, wherein the modularized sub-package includes a plurality of electrical components, a first mold layer, and a redistribution layer;
a first die and a second die over the package substrate, wherein the modularized sub-package is disposed between the first die and the second die;
a plurality of interconnects coupled to the first and second dies, the modularized sub-package, and the package substrate, wherein the redistribution layer of the modularized sub-package couples the first and second dies to the package substrate with the plurality of interconnects;
a first conductive pad on a top surface of the redistribution layer of the modularized sub-package, wherein the first conductive pad is located on an outer edge of the redistribution layer;
a plurality of second conductive pads on a top surface of the package substrate;
a plurality of third conductive pads on top surfaces of the first and second dies; and
a plurality of adhesive layers coupled to the first and second dies, wherein the plurality of adhesive layers has a first adhesive layer that couples the second die to the top surface of the package substrate, wherein the plurality of adhesive layers has a second adhesive layer that couples the first die to the top surface of the redistribution layer of the modularized sub-package, and wherein the plurality of adhesive layers has a third adhesive layer that couples the second die to a surface of the mold layer of the first modularized sub-package.

19. The SiP of claim 18, wherein the plurality of electrical components have top surfaces and bottom surfaces that are opposite to the top surfaces, wherein the bottom surfaces of the electrical components are coupled to the bottom surface of the redistribution layer, and wherein the top surfaces of the electrical components are parallel to a surface of the mold layer, wherein the first conductive pad has an exposed surface that is substantially planar to the top surface of the redistribution layer, and wherein the redistribution layer is a dual-sided redistribution layer.

20. The SiP of claim 19, wherein the surface of the mold layer is positioned below the top surfaces of the plurality of electrical components, or wherein the surface of the mold layer is substantially planar to one or more of the top surfaces of the plurality of electrical components.

\* \* \* \* \*